(12) United States Patent
Visyaschev et al.

(10) Patent No.: US 9,052,353 B2
(45) Date of Patent: Jun. 9, 2015

(54) METHOD FOR LOCATING SHORT CIRCUIT IN AN OVERHEAD POWER TRANSMISSION LINE BY UNSYNCHRONIZED MEASUREMENTS AT BOTH ENDS THEREOF

(71) Applicant: FEDERALNOYE GOSUDARSTVENNOYE BUDZHETNOYE OBRAZOVATELNOYE UCHREZHDENIE VYSSHEGO OBRAZOVANIYA "IRKUTSKI NATSIONALNY ISSLEDOVATELSKI TEHNICHESKI UNIVERSITET" (FGBOU VO "IRNITU"), Irkutsk (RU)

(72) Inventors: Alexandr Nikandrovich Visyaschev, Irkutsk (RU); Eduard Ruslanovich Plenkov, Irkutsk (RU); Stepan Georgievich Tiguntsev, Irkutsk (RU)

(73) Assignee: FEDERALNOYE GOSUDARSTVENNOYE BUDZHETNOYE OBRAZOVATELNOYE UCHREZHDENIE VYSSHEGO OBRAZOVANIYA "IRKUTSKI NATSIONALNY ISSLEDOVATELSKI TEHNICHESKI UNIVERSITET" (FGBOU VO "IRNITU"), Irkutsk (RU)

( * ) Notice: Subject to any disclaimer, the term of this patent is extended or adjusted under 35 U.S.C. 154(b) by 55 days.

(21) Appl. No.: 14/055,598

(22) Filed: Oct. 16, 2013

(65) Prior Publication Data
US 2014/0111219 A1    Apr. 24, 2014

(30) Foreign Application Priority Data

Oct. 24, 2012  (RU) ................................. 2012145289

(51) Int. Cl.
*G01R 31/14* (2006.01)
*G01R 21/00* (2006.01)
*G01R 31/08* (2006.01)
*G01R 15/26* (2006.01)

(52) U.S. Cl.
CPC ............ *G01R 31/085* (2013.01); *G01R 31/088* (2013.01); *G01R 15/26* (2013.01)

(58) Field of Classification Search
CPC ..... G01R 31/085; G01R 31/088; G01R 15/26
USPC ........................................................ 324/522
See application file for complete search history.

(56) References Cited

U.S. PATENT DOCUMENTS 6,002,260 A * 12/1999 Lau et al. ...................... 324/522

FOREIGN PATENT DOCUMENTS

RU        2009137563 A        4/2011

OTHER PUBLICATIONS

"Technologies for Developing Energy-Efficient Systems for Transmission, Distribution, and Consumption of Heat and Electric Power (Alphabetical and Subject Index to the International Patent Classification of Priority Development Areas of Science and Technologies)," Yu.G. Smirnov, Ye.V. Skidanova, and S.A. Krasnov, Patent Publishers, Moscow, 2008, p. 97.

(Continued)

*Primary Examiner* — Melissa Koval
*Assistant Examiner* — Farhana Hoque
(74) *Attorney, Agent, or Firm* — Collard & Roe, P.C.

(57) ABSTRACT

The claimed invention relates to the power industry and can be used for locating short circuits in power transmission lines by measuring the instantaneous current and voltage values when unsynchronized measurements are taken at both ends of the line. It is a technological object of the invention to improve the accuracy of damage location. The technical result of the invention is achieved by accurately synchronizing the current and voltage values measured at the ends of the line and unsynchronized in time on measurement. Synchronization is effected by aligning the oscillograms at both ends of the line with the short circuit start section.

1 Claim, 3 Drawing Sheets

(56) References Cited

OTHER PUBLICATIONS

"Methods and Devices for Locating Short Circuit in a Line," Textbook, Ivanovo State Electrical Engineering University, 1998, pp. 40-41.

"Technology of Parameter Vector Registration and Its Use for Controlling the Operation Modes of the Russian Integrated Power System," Electro, No. 2, 2011, pp. 2-5.

* cited by examiner

METHOD FOR LOCATING SHORT CIRCUIT IN AN OVERHEAD POWER TRANSMISSION LINE BY UNSYNCHRONIZED MEASUREMENTS AT BOTH ENDS THEREOF

CROSS REFERENCE TO RELATED APPLICATIONS

Applicant claims priority under 35 U.S.C. §119 of Russian Application No. 2012145289 filed on Oct. 24, 2012, the disclosure of which is incorporated by reference.

The claimed invention relates to the power industry and is suitable for locating a short circuit in power transmission lines by unsynchronized measurements taken at both ends thereof.

The invention relates to a prioritized area in the development of science and engineering, "Technologies for Developing Energy-Efficient Systems for Transmission, Distribution, and Consumption of Heat and Electric Power (Alphabetical and Subject Index to the International Patent Classification of Priority Development Areas of Science and Technologies)," Yu. G. Smirnov, Ye. V. Skidanova, and S. A. Krasnov, Patent Publishers, Moscow, 2008, p. 97), because it reduces delays in electric power delivery to consumers in consequence of damage caused to power transmission lines.

A prior art method for locating damage to overhead electric power transmission lines (Application RU No. 2009137563/28, G01R31/08, January 2006, published on Apr. 20, 2011) provides for measuring phase voltages and currents at both ends of the line, converting the measured values to compound rated values using the formulas claimed in the application, and further using the imaginary parts of the rated values to calculate the relative and physical distances of the damage point from the ends of the line. The prior art method does not use the equivalent parameters of the supply systems, and it eliminates the influence of the transient resistance.

The prior art invention has the following features identical to the essential features of the claimed method: measurement taken at both ends of the line (' designates one end of the line and " marks the second end of the line) that are not synchronized according to the angles of phase currents ($\dot{I}'_A, \dot{I}'_B, \dot{I}'_C$) and ($\dot{I}''_A, \dot{I}''_B, \dot{I}''_C$) and voltages ($\dot{U}'_A, \dot{U}'_B, \dot{U}'_C$) and ($\dot{U}''_A, \dot{U}''_B, \dot{U}''_C$) of the reference frequency at the short circuit time by calculation using the results of measurements taken at both ends of the line, and determination of the relative distance n to the short circuit point and the distance $l_k = n \cdot l$ to the short circuit point.

The prior art method is disadvantageous because it requires the imaginary components of the rated values only to be used.

This disadvantage may cause an error in locating the damage point because of insufficient data of the parameters used.

Another prior art method is used to locate a short circuit point in an overhead power transmission line by measuring the instantaneous current and voltage values at one end of the line ("Methods and Devices for Locating Short Circuit in a Line," Textbook, Ivanovo State Electrical Engineering University, 1998).

The method of the textbook provides for measuring the phase current, zero-sequence current, and phase voltage at one end of the line and choosing the time moment when current at the short circuit point is equal to zero as suggestion that the voltage drop at the transient resistance is equal to zero, and the distance to the short circuit point is found from the ratio of the instantaneous voltage value at that end of the line to the specific voltage drop per kilometer of the line.

The distance to the short circuit point is found similarly by measurements at the other end of the line.

The features of the prior art method that are identical to the essential features of the claimed method include measurement of the phase currents ($i'_A, i'_B, i'_C$) and ($i''_A, i''_B, i''_C$) and voltages ($u'_A, u'_B, u'_C$) and ($u''_A, u''_B, u''_C$) unsynchronized in time on short circuit occurrence, and finding the relative distance n to the short circuit point and the distance $l_k = n \cdot l$ to the short circuit point by calculations based on measurements at both ends of the line.

The prior art method is disadvantageous because it gives no consideration to the shift angle between the vector diagrams at the ends of the line at the short circuit time and requires the zero-sequence current to be measured in addition to the phase current. Besides, the method is practiced in integral values only and is only described analytically in instantaneous values. It is not clear, therefore, how the instantaneous voltage at the given end of the line and the specific voltage drop per kilometer of the line at the moment when the zero-sequence current $i_0$ crosses the zero instantaneous value is substituted with the calculated projection to an imaginary axis normal to the vector of the zero-sequence current $I_0$ of the integral values $U_\Phi$, and $\Delta U_\Phi$ and the distance to the short circuit point is determined from the imaginary values of the said integral quantities.

This disadvantage may result in error in locating the damage point because of insufficient data of the parameters used.

A further prior art method for locating the damage point in an overhead power transmission line ("Technology of Parameter Vector Registration and Its Use for Controlling the Operation Modes of the Russian Integrated Power System," Electro, No. 2, 2011, pp. 2-5) chosen by the applicants as immediate prior art dispenses with the need for using imaginary rated values. The prior art method provides for preliminary measurement of the angle between currents at the ends of the line by using digital communication channels between the line ends or by satellite time synchronization. When digital communication channels are used, the angles are measured by taking samples synchronized in time or by constantly calculating the time it takes the signal to pass between the differential line protection half-sets. When satellite time synchronization is used, time synchronization pulses are received from GLONASS (GPS) signal receivers. Next, phase voltages and currents are measured at both ends of the line and converted to rated compound values using the formulas given in the method description, and then the integral parts of the rated values are used to calculate relative and physical distances of the damage point from the line ends. The method does not use the equivalent parameters of the supply systems and it eliminates the influence of the transient resistance.

The features of the immediate prior art method identical to the essential features of the claimed method include measuring phase currents and voltages at the time of short circuit in the line at both ends thereof, giving consideration to the angle between the currents and voltages at the ends of the line, and determining the distance to the short circuit point from the ratio of the quantities measured.

The basic distinction of the prior art method is the possibility of consideration being given to the influence of supply coming from the opposite end of the line and the error caused by the transient resistance at the short circuit point being eliminated. The method does not require a full-scale simulation of the grid, that is, a program for calculating the steady and emergency operating modes of the grid. Besides, it does not require preliminary measurements of the load current to be made and used to compensate for the error caused by load.

The prior art method is disadvantageous because it requires complicated equipment, such as digital communication channels between the ends of the line to be used when the angles are measured taking synchronized time samples or calculating continuously the time a signal needs to pass between the differential protection half-sets, or satellite time-synchronization equipment when time synchronization pulses are received from GLONASS (GPS) signal receivers.

This disadvantage complicates damage point location significantly and, for this reason, the method cannot be used everywhere because of the lack of appropriate equipment.

The disadvantages listed above make location of the damage point significantly more complicated, and the method is not fit for any point because of the lack of equipment needed.

It is an object of the claimed invention to develop technologies helping to improve power supply efficiency.

The technical result of this invention lies in improved accuracy of damage point location achieved by accurate synchronization of currents and voltages measured at the ends of the line that are not synchronized in time upon measurement.

This technical result is achieved in a method for locating a short circuit point in a power transmission line by taking measurements at both ends thereof, the line having a length l, a real phase resistance R, and an inductive phase resistance $X_L$ and connecting two supply systems, said method comprising measuring the instantaneous values of the phase currents ($i'_A, i'_B, i'_C$) and ($i''_A, i''_B, i''_C$) and voltages ($u'_A, u'_B, u'_C$) and ($u''_A, u''_B, u''_C$) that are not synchronized in time on short circuit occurrence at both ends of the line (' designates one end of the line and " marks the second end of the line) and identifying the type of short circuit; according to the invention, producing current and voltage oscillograms; aligning the oscillograms at both ends of the line along the short circuit starting section; choosing a section for the damaged phase current and voltage oscillograms at a distance of two or three periods from the start of short circuit; and measuring the relative distance n to the short circuit point from the formula:

$$n = \frac{(u' - u'') + R \cdot i'' + X_L \cdot \frac{di''}{dt}}{R \cdot (i' + i'') + X_L \cdot \left(\frac{di'}{dt} + \frac{di''}{dt}\right)}, \quad (1)$$

wherein:

u' and u" are the instantaneous values of voltages produced in the section of the damaged phase voltages at the first and second ends of the line (V);

i' and i" are the instantaneous values of currents produced in the section of the damaged phase current oscillograms at the first and second ends of the line (A);

di'/dt and di"/dt are time-specific current derivatives (A/C); and

R and $X_L$ are real and inductive phase resistances of the line (Ohm).

At the next step, the distance from the line end marked by ' to the short circuit point is found from formula: l'=n·l.

The distinctions of the claimed method from the immediate prior art are proof of the novelty of the claimed embodiments of the invention as recited in the claim.

The applicants' new approach helps synchronize voltages and currents at the ends of the line when the measurements made at both ends thereof are not synchronized by aligning the oscillograms at the two ends of the line along the short circuit start section; improve the accuracy of damage location; and make the method practicable through the use of simple devices and methods, in the absence of complicated equipment and laborious calculations and complex mathematical conversions, all these advantages confirming compliance of the claimed inventions with the "industrial applicability" patentability criterion.

The essential distinguishing features of the claimed methods recited in the claim are not disclosed in prior art, which is evidence of their compliance with the "inventive level" patentability criterion.

Figure 1:
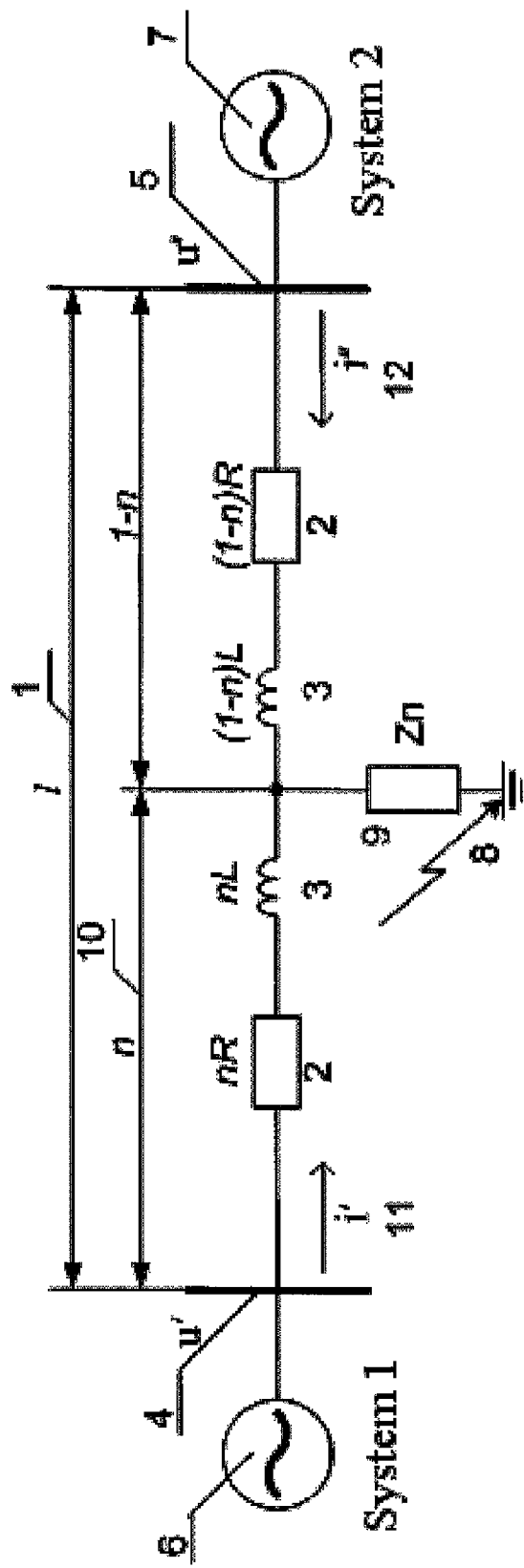
FIG. 1 is a general diagram showing substitution of the power transmission line at the time of short circuit therein.

FIG. 1 illustrates a one-line diagram substituting for a power transmission line having a length (l), real phase resistance 2 (R) and inductive phase resistance 3 ($X_L$), connecting buses 4 and 5 of two systems 6 and 7 having equivalent parameters (EMF and complex impedances). The line is shown to be short-circuited at 8 downstream of transient resistance 9 ($Z_T$) at a distance 10 (n) from one end of the line. When a short circuit occurs in the line, current 11 (i') flows therein from buses 4 and current 12 (i") flows from buses 5. Instantaneous phase currents ($i'_A, i'_B, i'_C$) and ($i''_A, i''_B, i''_C$) and voltages ($u'_A, u'_B, u'_C$) and ($u''_A, U''_B, u''_C$) unsynchronized in time are measured across buses 4 and 5 at both ends of the line at the short circuit time.

Figure 2:
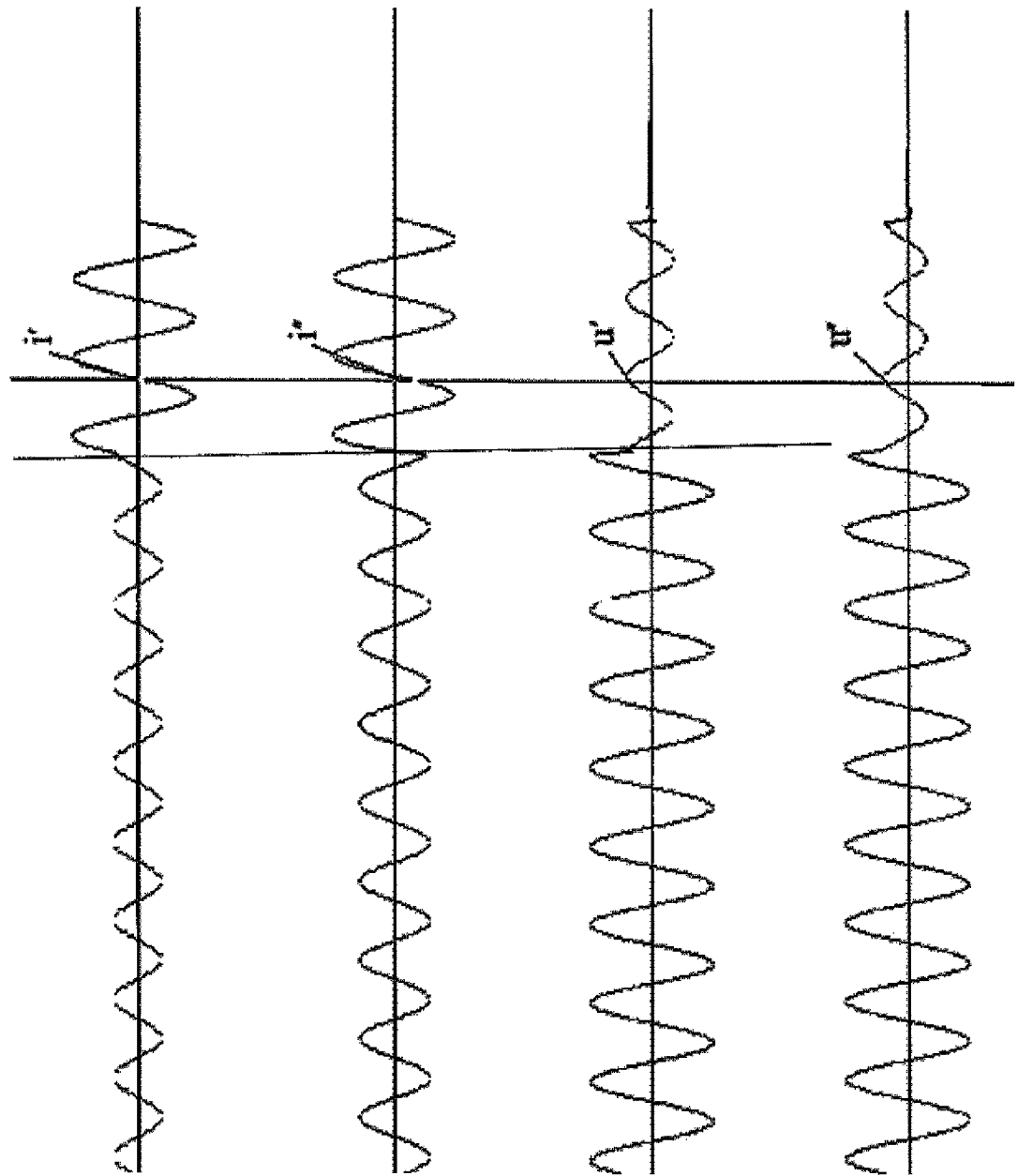
FIG. 2 shows oscillograms of currents and voltages in the damaged phase of the line at both ends thereof during a single-phase short circuit in the line.

FIG. 2 shows sections in the oscillograms of currents and voltages in the damaged phase of the line at both ends thereof when a single-phase short circuit occurs in the line. It shows a section crossing the start of the short circuit (vertical line at left), on which the oscillograms of the first and second ends of the line are aligned, and a section one period (vertical line at right) after short circuit occurrence, in which the instantaneous currents i' and i" and voltages u' and u" are measured.

Figure 3:
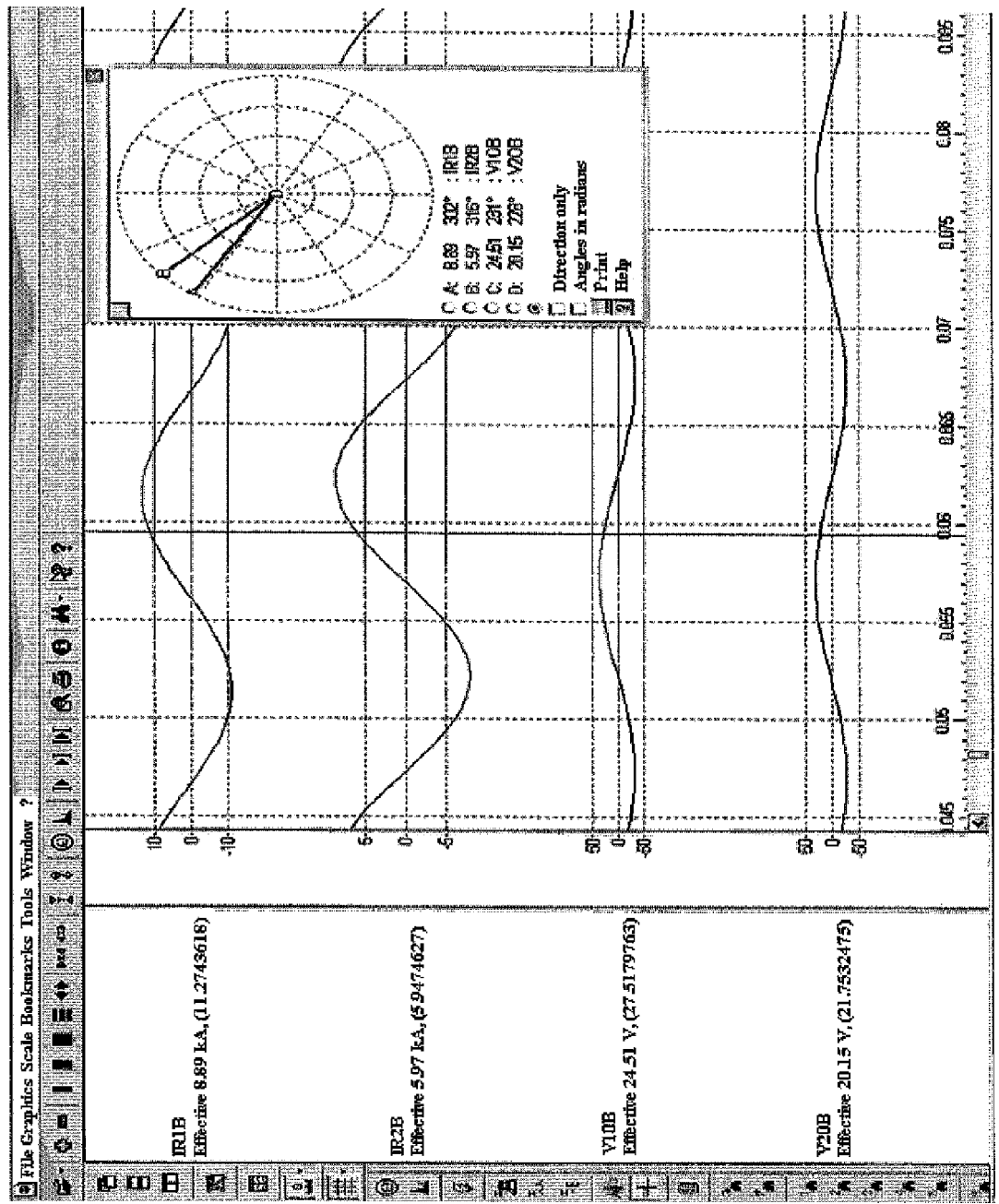
FIG. 3 shows oscillograms of currents and voltages in the damaged phase of the line at both ends thereof during single-phase short circuit in a line model.

FIG. 3 shows a section in the oscillograms of currents and voltages in the damaged phase of a line at both ends thereof during a single-phase short circuit in a line model. This is the section in which the instantaneous values of currents i' and i" and voltages u' and u" are measured one period after the short circuit, wherein:

IR1B is an oscillogram of current at the head of the damaged phase line;

IR2B is an oscillogram of current at the end of the damaged phase line;

V10B is an oscillogram of voltage across the buses at the head of the line; and

V20B is an oscillogram of voltage across the buses at the end of the line.

With reference to FIG. 1, single-phase short circuit 8 in a single-circuit two-way supply line is considered below. The emergency mode parameters (($i'_A, i'_B, i'_C$), ($i''_A, i''_B, i''_C$), ($u'_A, u'_B, u'_C$), and ($u''_A, u''_B, u''_C$)) have been measured at both ends, and so the influence of transient resistance 9 ($R_T$) and supply systems 6 and 7 can be ignored.

Voltage drop upstream of the short circuit point at both ends of the line (FIG. 1) can be written down as:

$$u' - n \cdot i' \cdot R - n \cdot \frac{di'}{dt} = u'' - (1 - n) \cdot i'' \cdot R - (1 - n) \cdot X_L \cdot \frac{di''}{dt}. \quad (2)$$

Following conversion, equation (2) is transformed to equation (1).

To perform the method described by formula (1), the instantaneous values of phase currents ($i'_A, i'_B, i'_C$) and ($i''_A, i''_B, i''_C$) and voltages ($u'_A, u'_B, u'_C$) and ($u''_A, u''_B, u''_C$) that are not synchronized in time are measured on short circuit occurrence; damaged phases are identified; current and voltage oscillograms are constructed; the oscillograms are aligned at both ends along the short circuit start section (FIG. 2); a section is chosen within the interval of two to ten periods from the short circuit start for damaged phase current and voltage oscillograms; readings are taken of the instantaneous values of currents i' and i" and voltages u' and u" (FIG. 3); time-specific current derivatives di'/dt and di"/dt are calculated; the relative distance n to the short circuit point is found from formula (1); and the distance to the short circuit point from the line end identified by mark ' is found from formula: l'=n·l.

The values of di'/dt and di"/dt are found by any common method, for example, by using the m-th i(mT) and preceding i(mT−T) samples of the instantaneous current values in the section area:

$$i = i(mT),$$

$$\frac{di}{dt} = \frac{1}{T}(i(mT) - i(mT - T)),$$

wherein:

i(mT) is a sequence of instantaneous current values read off the oscillograms (a), and T is the sampling period (angle or time between two neighboring points of an oscillogram).

The time-specific current derivative can be found similarly from the formula:

$$\frac{di}{dt} = I_m \cdot \text{Cos}(\varphi_k),$$

wherein: $I_m$ is current amplitude (a) and $\varphi_k$ is the angle from the head of the current sine wave to the section in the selected period (in degrees).

An example of a line model circuit is considered below (with reference to FIG. 1):

| | |
|---|---|
| Length of the line | 50 km |
| Length of the damaged portion of the line | 25 km |
| Real resistance of the line | 0.945 Ohm |
| Inductive resistance of the line | 13.25 Ohm |
| Power of System 1 | 8.000 MVA |
| Power of System 2 | 6.000 MVA |

The instantaneous values of currents i' and i" and voltages u' and u" in the damaged phase are found from the oscillogram in FIG. 3 and time-specific current derivatives di'/dt and di"/dt are calculated (in Excel).

Head of the line. u'=100051.9 V

| Angle (degrees) | i' (A) | di'/dt (A/C) |
|---|---|---|
| 4 | 884.160249 | 13387.81654 |
| 13 | 2915.84763 | 12934.13451 |
| 22 | 4891.09925 | 12574.85299 |
| 31 | 6766.020629 | 11936.13030 |
| 40 | 8484.176007 | 10938.12610 |
| 49 | 9995.400262 | 9620.76054 |
| 58 | 11274.61084 | 8143.71012 |
| 67 | 12271.64261 | 6347.30675 |
| 76 | 12967.68365 | 4431.13867 |
| 84 | 13343.92206 | 2694.61136 |
| 93 | 13387.81654 | 279.44118 |
| 102 | 13099.36709 | −1836.32774 |
| 111 | 12484.84437 | −3912.17649 |
| 120 | 11556.78964 | −5908.18489 |
| 129 | 10352.82675 | −7664.67230 |
| 138 | 8891.767611 | −9301.39920 |
| 147 | 7217.506714 | −10658.68491 |
| 156 | 5373.938535 | −11736.52946 |
| 165 | 3404.957555 | −12534.93282 |

End of the line. u"=79091 V

| Angle (degrees) | i" (A) | di"/dt (A/C) |
|---|---|---|
| 4 | 605.86822 | 8682.428808 |
| 13 | 1961.5448 | 8630.51245 |
| 22 | 3270.97202 | 8336.07963 |
| 31 | 4383.23304 | 7080.87955 |
| 40 | 5515.67301 | 7209.34285 |
| 49 | 6509.61656 | 6327.64651 |
| 58 | 7336.60089 | 5264.75021 |
| 67 | 7975.70463 | 4068.66421 |
| 76 | 8376.51193 | 2551.62068 |
| 84 | 8604.51026 | 1632.91913 |
| 93 | 8643.76322 | 249.89232 |
| 102 | 8459.8789 | −1170.64493 |
| 111 | 8059.57337 | −2548.42631 |
| 120 | 7523.35094 | −3413.70090 |
| 129 | 6739.28661 | −4991.51277 |
| 138 | 5783.69898 | −6083.46493 |
| 147 | 4682.16308 | −7012.60126 |
| 156 | 3458.95065 | −7787.21877 |

Damage Point Location

The short circuit point is found from the instantaneous current and voltage values at a section angle of 58° from Equation (1):

$$n = \frac{(100051.9 - 79091) + 7336.6 \cdot 0.945 + 5264.75 \cdot 13.25}{(11274.6 + 7336.6) \cdot 0.945 + (8143.71 + 5264.75) \cdot 13.25} = 0.5001$$

The calculated distance to the damage point is:

l'=n·l=0.5001·50=25.005 km.

The actual distance to the short circuit point is equal to 25 km. The check has, therefore, confirmed the high accuracy of the claimed method for locating the damage point.

The claimed method is also suitable for locating other types of short circuits—two-phase shorting, ground shorting, and three-phase shorting.

Damage location by the claimed method for the circuit of FIG. 1 has also demonstrated complete absence of methodological errors in the presence of a transient resistance of 5 to 50 Ohms and on changes in load within a wide range. No errors occur in measurements at the side of either the low-power system or the high-power system.

Measured instantaneous currents and voltages in a damaged phase can, therefore, be used to achieve accurate time synchronization in an unsynchronized two-way measurement by aligning the oscillogram at both ends of the line with the section marking the start of short circuit and, as a result, determine more accurately the distance to the short circuit point and an accurate angle between the voltages and currents at the ends of the line.

The readings of the angle between voltages and currents at the ends of the line can be used for other purposes, for example, for analyzing the operating mode of another portion of the grid.

What is claimed is:

1. A method for locating a short circuit point in an overhead power transmission line by taking unsynchronized measurements at both ends thereof, said line having a length l, a real resistance R, and an inductive resistance $X_L$ and connecting two supply systems, said method comprising measuring the phase currents and voltages unsynchronized in time at both ends of the line during a short circuit; identifying the damaged phases; and determining the relative distance n to the short circuit point at the end of the line marked by ' from the formula l'=n*l, where l' represents when a short circuit occurs in the line; wherein the instantaneous values of phase currents ($i'_A$, $i'_B$, $i'_C$) and ($i''_A$, $i''_B$, $i''_C$) and voltages ($u'_A$, $u'_B$, $u'_C$) and ($u''_A$, $u''_B$, $u''_C$) are measured at both ends of the line (' designates one end of the line and " marks the other end of the line) during a short circuit; oscillograms are constructed for currents and voltages; the oscillograms at both ends of the line are aligned in the short circuit start section; a section in the oscillograms of damaged phase current and voltage is chosen within the interval of two to ten periods from the start of the short circuit; the instantaneous values of currents i' and i" and voltages u' and u" are read off in the section and at neighboring points; time-specific current derivatives di'/dt and di"/dt are calculated; and the relative distance n to the short circuit point is determined from the formula:

$$n = \frac{(u' - u'') + R \cdot i'' + X_L \cdot \frac{di''}{dt}}{R \cdot (i' + i'') + X_L \cdot \left(\frac{di'}{dt} + \frac{di''}{dt}\right)},$$

wherein:
u' and u" are instantaneous voltage values obtained in the section of the damaged phase voltage oscillograms at one and the other ends of the line (V);
i' and i" are instantaneous current values obtained in the section of the damaged phase current oscillograms at one and the other ends of the line (A);
di'/dt and d"/dt are time-specific current derivatives (A/C); and
R and $X_L$ are the real and inductive phase resistances of the line (Ohms).

* * * * *